United States Patent
Oooka et al.

(10) Patent No.: US 10,749,059 B2
(45) Date of Patent: Aug. 18, 2020

(54) PHOTOELECTRIC CONVERSION DEVICE AND METHOD OF MANUFACTURING THE SAME

(71) Applicant: KABUSHIKI KAISHA TOSHIBA, Minato-ku (JP)

(72) Inventors: Haruhi Oooka, Kawasaki (JP); Hideyuki Nakao, Yokohama (JP)

(73) Assignee: KABUSHIKI KAISHA TOSHIBA, Minato-ku (JP)

(*) Notice: Subject to any disclaimer, the term of this patent is extended or adjusted under 35 U.S.C. 154(b) by 29 days.

(21) Appl. No.: 15/922,036

(22) Filed: Mar. 15, 2018

(65) Prior Publication Data

US 2019/0081194 A1    Mar. 14, 2019

(30) Foreign Application Priority Data

Sep. 14, 2017   (JP) .................................. 2017-176774

(51) Int. Cl.
*H01L 31/04*     (2014.01)
*H01L 31/0224*   (2006.01)
(Continued)

(52) U.S. Cl.
CPC ...... *H01L 31/04* (2013.01); *H01L 31/022475* (2013.01); *H01L 31/022483* (2013.01);
(Continued)

(58) Field of Classification Search
CPC ............. H01L 31/04; H01L 31/022475; H01L 31/022483; H01L 31/1884; H01L 51/0023
See application file for complete search history.

(56) References Cited

U.S. PATENT DOCUMENTS

2008/0264473 A1* 10/2008 Cumpston ......... H01L 31/03528
                                                    136/251
2012/0204931 A1   8/2012 Seike
(Continued)

FOREIGN PATENT DOCUMENTS

JP    2001-1237442   *  8/2001
JP    2011-119695       6/2011
(Continued)

OTHER PUBLICATIONS

Office Action dated Jun. 26, 2018 in Japanese Patent Application No. 2017-176774.

*Primary Examiner* — Jayne L Mershon
(74) *Attorney, Agent, or Firm* — Oblon, McClelland, Maier & Neustadt, L.L.P.

(57) ABSTRACT

A photoelectric conversion device of an embodiment includes: a first photoelectric conversion part including a first transparent electrode provided on a transparent substrate, a first active layer, and a first counter electrode; and a second photoelectric conversion part including a second transparent electrode, a second active layer, and a second counter electrode. A conductive layer containing noble metal as a main component is formed on a partial region of the second transparent electrode, and a fine particle layer having a stack of fine particles is formed on the conductive layer. The first counter electrode and the second transparent electrode are electrically connected by a connection part having a scribe groove penetrating through the fine particle layer from the second active layer and exposing a surface of the conductive layer, and a conductive layer having a part of the first counter electrode filled in the scribe groove.

8 Claims, 7 Drawing Sheets

(51) Int. Cl.
  *H01L 31/18*   (2006.01)
  *H01L 31/046*  (2014.01)
  *H01L 51/00*   (2006.01)
  *H01G 9/20*        (2006.01)
  *H01L 51/42*       (2006.01)
  *H01L 51/44*       (2006.01)

(52) U.S. Cl.
  CPC ........ *H01L 31/046* (2014.12); *H01L 31/1884* (2013.01); *H01L 51/0023* (2013.01); *H01G 9/2022* (2013.01); *H01L 51/4253* (2013.01); *H01L 51/441* (2013.01)

(56)  References Cited

U.S. PATENT DOCUMENTS

| | | | |
|---|---|---|---|
| 2012/0204939 A1* | 8/2012 | Lee | H01L 31/0749 |
| | | | 136/249 |
| 2015/0228820 A1* | 8/2015 | Chen | H01L 31/0749 |
| | | | 136/256 |
| 2016/0276611 A1 | 9/2016 | Oooka et al. | |
| 2017/0005282 A1* | 1/2017 | Maehara | H01L 51/4273 |
| 2018/0062099 A1 | 3/2018 | Oooka et al. | |

FOREIGN PATENT DOCUMENTS

| | | |
|---|---|---|
| JP | 2013-152980 | 8/2013 |
| JP | 5715795 | 5/2015 |
| JP | 2016-178172 | 10/2016 |
| JP | 2016-195175 | 11/2016 |
| JP | 6030176 | 11/2016 |

\* cited by examiner

PHOTOELECTRIC CONVERSION DEVICE AND METHOD OF MANUFACTURING THE SAME

CROSS-REFERENCE TO RELATED APPLICATION

This application is based upon and claims the benefit of priority from Japanese Patent Application No. 2017-176774, filed on Sep. 14, 2017; the entire contents of which are incorporated herein by reference.

FIELD

Embodiments described herein generally relate to a photoelectric conversion device and a method of manufacturing the same.

BACKGROUND

Organic semiconductors and organic/inorganic hybrid semiconductors are expected to be applied to photoelectric conversion devices such as a photovoltaic, a light emitting element, and a photosensor. Using these semiconductors as, for example, forming materials of active layers of photoelectric conversion devices such as a photovoltaic makes it possible to employ an inexpensive coating method for forming the active layers and the like, and thus enables a great reduction in a formation cost of the active layers and the like. Because of this, an organic photovoltaic and an organic/inorganic hybrid photovoltaic are expected as next-generation photovoltaics that cost low and are harmless.

Cells forming a photovoltaic module each have a structure in which an active layer is sandwiched by a transparent electrode and a counter electrode. As the transparent electrode, a transparent conductive oxide not having sufficient conductivity is typically used, and accordingly, as the area of the cell increases, efficiency for extracting generated electric charges to the outside deteriorates more. To solve this, a plurality of strip-shaped cells are formed side by side and the plural cells are connected in series. A series photovoltaic module having the plural cells is formed by the following method, for instance. Transparent electrodes of the respective cells are formed on a transparent substrate. An active layer is formed on the whole surface of the plural transparent electrodes by coating. Parts of the active layer are scribed, whereby grooves from which the transparent electrodes are exposed are formed. Counter electrodes are formed on the active layer having the scribe grooves so as to correspond to the respective cells. At this time, in the scribe groove, the counter electrode of the adjacent cell is filled, so that the counter electrode of the adjacent cell is electrically connected with the transparent electrode exposed to the inside of the scribe groove.

The scribing of the active layer is executed by mechanical scribing using a cutting tool or laser scribing using laser light, for instance. The hard transparent conductive oxide layer exists under the soft, viscous, and low-brittleness active layer, and thus at the time of scribing the active layer, the active layer is likely to remain in the scribe grooves and on the conductive metal oxide. The active layer, if remaining, increases electrical resistance between the counter electrode of the adjacent cell and the transparent electrode, resulting in deterioration of power conversion efficiency. Increasing a scribing pressure or output power of laser in order to prevent the active layer from remaining is likely to cause a crack or the like in the transparent conductive oxide layer. In a case where the substrate as the base of the transparent conductive oxide layer is a soft substrate such as a resin substrate, the increase in the pressure especially at the time of the mechanical scribing causes the soft substrate to deform by being pushed by a cutting tool, which is more likely to cause a crack in the transparent conductive oxide layer.

In order to prevent the crack of the transparent conductive oxide layer while reducing the remaining of the active layer at the time of the scribing, studies are being made on forming a conductive layer under part of the active layer that is to be scribed and scribing the active layer together with a thickness-direction part of the conductive layer. Since the thickness-direction part of the conductive layer which is easy to scribe is scribed together with the active layer, it is possible to reduce the remaining of the active layer. Further, since the easiness of scribe of the active layer is enhanced, it is possible to reduce, for example, a load of an excessive pressure to the transparent conductive oxide layer. However, if part of the conductive layer is, for example, mechanically scribed, cutting chips of the conductive layer produced at the time of the scribing may become the residue in the periphery. Such cutting chips of a conductive substance cause a short circuit or the like between the cells. The above circumstances have given rise to a demand for an art to improve electrical connectivity between the adjacent cells (photoelectric conversion parts) by achieving both the reduction of the remaining of the active layer on the transparent electrodes and the prevention of breakage of the transparent electrodes and by inhibiting a short circuit or the like between the cells due to the cutting chips of the conductive substance, at the time of the scribing of the active layer.

DETAILED DESCRIPTION

A photoelectric conversion device of an embodiment includes: a transparent substrate; a first photoelectric conversion part including a first transparent electrode provided on the transparent substrate, a first active layer disposed on the first transparent electrode, and a first counter electrode disposed on the first active layer; a second photoelectric conversion part including a second transparent electrode provided on the transparent substrate adjacently to the first transparent electrode and separated from the first transparent electrode, a conductive layer which is formed on a partial region adjacent to the first transparent electrode on the second transparent electrode and contains noble metal as a main component, a fine particle layer disposed on at least the conductive layer and having a stack of fine particles, a second active layer disposed to cover the second transparent electrode and the fine particle layer, and a second counter electrode disposed on the second active layer; and a connection part which includes a scribe groove formed between the first active layer and the second active layer, and a conductive portion filled in the scribe groove, the scribe groove penetrating through the second active layer and the fine particle layer to expose a surface of the conductive layer, and the conductive portion having a part of the first counter electrode filled in the scribe groove, the connection part electrically connecting the first counter electrode and the second transparent electrode via the conductive portion and the conductive layer.

Hereinafter, a photoelectric conversion device of an embodiment and a method of manufacturing the same will be described with reference to the drawings. Note that, in each embodiment, substantially the same constituent parts are denoted by the same reference signs and a description thereof will be partly omitted in some case. The drawings are schematic, and a relation of thickness and planar dimension, a thickness ratio among parts, and so on are sometimes different from actual ones. Terms indicating up and down directions and so on in the description indicate relative directions when a surface, of a later-described transparent substrate, where to form photoelectric conversion parts is defined as an up direction, unless otherwise noted, and they are sometimes different from actual directions based on a gravitational acceleration direction.

Figure 1:
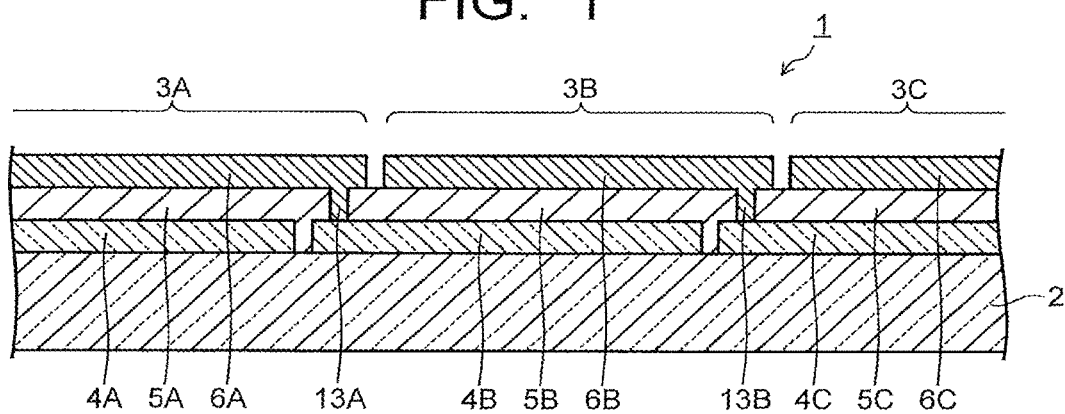
FIG. 1 is a sectional view illustrating a schematic structure of a photoelectric conversion device according to an embodiment.

FIG. 1 illustrates a schematic structure of the photoelectric conversion device of the embodiment. The photoelectric conversion device 1 illustrated in FIG. 1 includes a transparent substrate 2 functioning as a support substrate and a plurality of photoelectric conversion parts 3 (3A, 3B, 3C) disposed on the transparent substrate 2. The photoelectric conversion parts 3 each include a transparent electrode 4 (4A, 4B, 4C), a photoelectric conversion layer 5 (5A, 5B, 5C), and a counter electrode 6 (6A, 6B, 6C) which are formed on the transparent substrate 2 in the order mentioned.

The transparent substrate 2 is formed of a material having a light-transmitting property and insulation performance. As the constituent material of the transparent substrate 2, an inorganic material such as non-alkali glass, quartz glass, or sapphire, or an organic material such as polyethylene (PE), polyethylene terephthalate (PET), polyethylene naphthalate (PEN), polyimide, polyamide, polyamide-imide, or a liquid crystal polymer is used. For example, the transparent substrate 2 may be a rigid substrate formed of an inorganic material or an organic material, or may be a flexible substrate formed of an organic material or a very thin inorganic material.

In a case where the photoelectric conversion device 1 of the embodiment is a photovoltaic, the photoelectric conversion layer 5 is irradiated with light through the transparent substrate 2 and the transparent electrode 4. In a case where the photoelectric conversion device 1 is a light emitting element, light generated in the photoelectric conversion layer 5 is emitted through the transparent substrate 2 and the transparent electrode 4. To take the case where the photoelectric conversion device 1 is a photovoltaic as an example, charge separation is caused by the light irradiating the photoelectric conversion layer 5, so that electrons and holes are generated. Out of the electrons and the holes generated in the photoelectric conversion layer 5, for example, the electrons are collected in the transparent electrode 4, and the holes are collected in the counter electrode 6. The functions of the transparent electrode 4 and the counter electrode 6 may be reversed. Hereinafter, these parts will be described.

The transparent electrode 4 is formed of a material having a light-transmitting property and conductivity. As the constituent material of the transparent electrode 4, a conductive metal oxide such as indium oxide, zinc oxide, tin oxide, indium tin oxide (ITO), fluorine-doped tin oxide (FTO), gallium-doped zinc oxide (GZO), aluminum-doped zinc oxide (AZO), indium-zinc oxide (IZO), or indium-gallium-zinc oxide (IGZO) is used. The transparent electrode 4 may be a film stack of a layer formed of any of the aforesaid materials and a metal layer formed of metal such as gold, platinum, silver, copper, cobalt, nickel, indium, or aluminum, or an alloy containing any of these metals, within a range capable of maintaining the light-transmitting property. The transparent electrode 4 is formed by, for example, a vacuum deposition method, a sputtering method, an ion plating method, a CVD method, a sol-gel method, a plating method, a coating method, or the like.

The thickness of the transparent electrode 4 is not particularly limited, but is preferably not less than 10 nm nor more than 1 μm, and more preferably not less than 30 nm nor more than 300 nm. When the film thickness of the transparent electrode 4 is too thin, sheet resistance becomes high. When the film thickness of the transparent electrode 4 is too thick, light transmittance decreases, and further flexibility decreases, so that a crack or the like is likely to occur due to a stress. It is preferable to select the film thickness of the transparent electrode 4 so that high light transmittance and low sheet resistance are both obtained. The sheet resistance of the transparent electrode 4 is not particularly limited, but is typically 1000Ω/□ or less, preferably 500Ω/□ or less, and more preferably 200Ω/□ or less.

Figure 2:
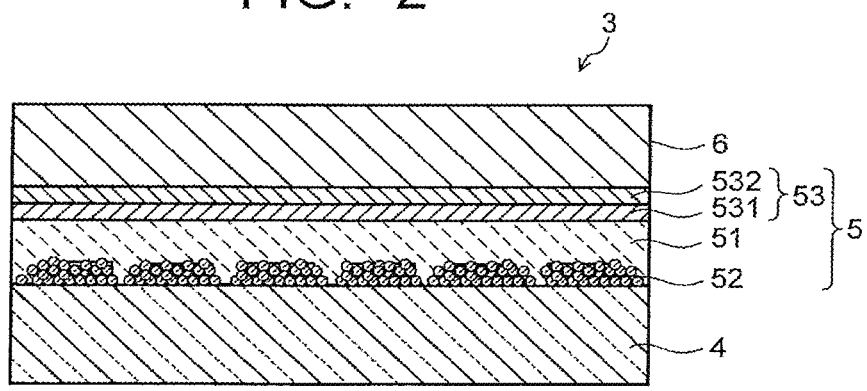
FIG. 2 is an enlarged sectional view illustrating a photoelectric conversion part in the photoelectric conversion device illustrated in FIG. 1.

As illustrated in FIG. 2, the photoelectric conversion layer 5 has an active layer 51, a transparent electrode-side intermediate layer 52 disposed between the transparent electrode 4 and the active layer 51, and a counter electrode-side intermediate layer 53 disposed between the active layer 51 and the counter electrode 6. The counter electrode-side intermediate layer 53 has a first counter electrode-side intermediate layer 531 and a second counter electrode-side intermediate layer 532. The transparent electrode-side intermediate layer 52 and the counter electrode-side intermediate layer 53 are disposed when necessary, and in some case, both or one of them may be omitted. The layers 51, 52, 53 forming the photoelectric conversion layer 5 are appropriately selected according to a device (a photovoltaic, a light emitting element, a photosensor, or the like) to which the photoelectric conversion device 1 is applied. Hereinafter, the case where the photoelectric conversion device 1 is used as a photovoltaic will be mainly described, but the photoelectric conversion device 1 of the embodiment is also applicable to a light emitting element, a photosensor, and the like.

In a case where the photoelectric conversion device 1 of the embodiment is applied to an organic/inorganic hybrid photovoltaic, the active layer 51 includes an organic/inorganic hybrid perovskite compound, for instance. The organic/inorganic hybrid perovskite compound is a compound having a composition expressed by $ABX_3$, for instance. The B site is a divalent cation, X is halogen, and the A site is a monovalent anion. It is empirical knowledge that a three-dimensional perovskite crystal is obtained and high power conversion efficiency is obtained in a case where a tolerance factor t expressed by the following expression is within a range of not less than 0.75 nor more than 1.1. In the following expression, a Shannon ionic radius is used, though there are several kinds of ionic radii.

$$t=(A \text{ site ionic radius}+X \text{ site ionic radius})/\{2^{1/2}\times(B \text{ site ionic radius}+X \text{ site ionic radius})\}$$

Examples of the A site include an organic amine compound such as $CH_3NH_4$, cesium, and rubidium. Examples of the B site include lead and tin. Examples of the X site include halogen elements such as iodine, bromine, and chlorine. Examples of a method for forming the active layer 51 include a method of depositing the aforesaid perovskite compound or its precursor by vacuum deposition, and a method of applying a solution in which the perovskite compound or its precursor is dissolved in a solvent, followed by heating and drying. Examples of the precursor of the perovskite compound include a mixture of methylammonium halide and lead halide or tin halide. The thickness of the active layer 51 is not particularly limited, but is preferably not less than 10 nm nor more than 1000 nm.

In a case where the photoelectric conversion device 1 is applied to an organic photovoltaics, the active layer 51 contains, for example, a p-type semiconductor and an n-type semiconductor. As the p-type semiconductor in the active layer 51, a material having an electron donating property is used, and as the n-type semiconductor, a material having an electron accepting property is used. The p-type semiconductor and the n-type semiconductor forming the active layer 51 both may be organic materials or one of them may be an organic material.

As the p-type semiconductor contained in the active layer 51, polythiophene and its derivative, polypyrrole and its derivative, a pyrazoline derivative, an arylamine derivative, a stilbene derivative, a triphenyldiamine derivative, oligothiophene and its derivative, polyvinyl carbazole and its derivative, polysilane and its derivative, a polysiloxane derivative having aromatic amine at a side chain or a main chain, polyaniline and its derivative, a phthalocyanine derivative, porphyrin and its derivative, polyphenylene vinylene and its derivative, polythienylene vinylene and its derivative, and the like are usable. These materials may be used in combination, or a mixture or a compound of any of these materials and another material may be used.

As the p-type semiconductor, polythiophene being a conductive polymer having a π-conjugated structure and its derivative are preferably used. Polythiophene and its derivative have excellent stereoregularity and are relatively high in solubility in a solvent. Polythiophene and its derivative are not particularly limited, provided that they are each a compound having a thiophene framework. Specific examples of polythiophene and its derivative include: polyalkylthiophene such as poly(3-methylthiophene), poly(3-butylthiophene), poly(3-hexylthiophene), poly(3-octylthiophene), and poly(3-decylthiophene); polyarylthiophene such as poly(3-phenylthiophene) and poly(3-(p-alkylphenylthiophene)); polyalkylisothionaphthene such as poly(3-butylisothionaphthene), poly(3-hexylisothionaphthene), poly(3-octylisothionaphthene), and poly(3-decylisothionaphthene); polyethylenedioxythiophene; poly[N-9'-heptadecanyl-2,7-carbazole-alt-5,5-(4,7-di-2-thienyl-2',1',3'-benzothiadiazole)] (PCDTBT); and poly[4,8-bis{(2-ethylhexyl)oxy}benzo[1,2-b:4,5-b']dithiophene-2,6-diyl-lt-alt-3-fluoro-2-{(2-ethylhexyl)carbonyl)}thieno[3,4-b]thiophene-4,6-diyl] (PTB7).

As the n-type semiconductor contained in the active layer 51, fullerene, a fullerene derivative, or the like is usable. The fullerene derivative may be any, provided that it has a fullerene framework. Examples of the fullerene and the fullerene derivative include fullerene such as $C_{60}$, $C_{70}$, $C_{76}$, $C_{78}$, and $C_{84}$, fullerene oxide being any of these fullerenes whose carbon atoms at least partly are oxidized, a compound in which part of carbon atoms of a fullerene framework is modified by optional functional groups, and a compound in which these functional groups are bonded to form a ring.

Examples of the functional group used for the fullerene derivative include: a hydrogen atom; a hydroxyl group; a halogen atom such as a fluorine atom and a chlorine atom; an alkyl group such as a methyl group and an ethyl group; an alkenyl group such as a vinyl group; a cyano group; an alkoxy group such as a methoxy group and an ethoxy group; an aromatic hydrocarbon group such as a phenyl group and a naphthyl group; and an aromatic heterocyclic group such as a thienyl group and a pyridyl group. Specific examples of the fullerene derivative include fullerene hydride such as $C_{60}H_{36}$ and $C_{70}H_{36}$, fullerene oxide being oxidized $C_{60}$ and $C_{70}$, and a fullerene metal complex. As the fullerene derivative, [6,6]phenyl$C_{61}$butyric acid methyl ester (PC60BM), [6,6]phenyl$C_{71}$butyric acid methyl ester (PC70BM), bis-indene$C_{60}$ (60ICBA), or the like is preferably used.

The active layer 51 has a bulk heterojunction structure containing a mixture of a p-type semiconductor material and an n-type semiconductor material, for instance. The active layer 51 of the bulk heterojunction type has a microphase-separated structure of the p-type semiconductor material and the n-type semiconductor material. In the active layer 51, a p-type semiconductor phase and an n-type semiconductor phase are separated from each other and form a pn junction on a nanometer order. When the active layer 51 absorbs light, positive charges (holes) and negative charges (electrons) are separated on an interface of these phases and they are transported to the electrodes 4, 6 through the respective semiconductors. The active layer 51 of the bulk heterojunction type is formed by applying a solution in which the p-type semiconductor material and the n-type semiconductor material are dissolved in a solvent, on the transparent substrate 2 having the transparent electrode 4 and so on. The thickness of the active layer 51 is not particularly limited, but is preferably not less than 10 nm nor more than 1000 nm.

In the case where the electrons generated in the photoelectric conversion layer 5 are collected in the transparent electrode 4, the transparent electrode-side intermediate layer 52 is formed of a material capable of selectively and efficiently transporting the electrons. As the constituent material of the transparent electrode-side intermediate layer 52 functioning as an electron transport layer, an inorganic material such as zinc oxide, titanium oxide, or gallium oxide, an organic material such as polyethyleneimine or its derivative, or a carbon material such as the aforesaid fullerene derivative is used, and the constituent material is not particularly limited.

In the case where the holes are collected in the transparent electrode 4, the transparent electrode-side intermediate layer 52 is formed of a material capable of selectively and efficiently transporting the holes. As the constituent material of the transparent electrode-side intermediate layer 52 functioning as a hole transport layer, an inorganic material such as nickel oxide, copper oxide, vanadium oxide, tantalum oxide, or molybdenum oxide, or an organic material such as polythiophene, polypyrrole, polyacetylene, triphenylenediaminepolypyrrol, polyaniline, or a derivative of any of these is used, and the constituent material is not particularly limited.

The transparent electrode-side intermediate layer 52 is formed of a fine particle layer having a stack of fine particles. The transparent electrode-side intermediate layer 52 includes a stack of fine particles that are a material functioning as the aforesaid electron transport layer or fine particles that are a material functioning as the aforesaid hole transport layer. As will be described in detail later, the fine particle layer prevents the remaining of the active layer 51, a load of an excessive pressure to the transparent electrode 4, the occurrence of the residue due to cutting chips of a later-described conductive layer 12, and so on at the time of the scribing of the active layer 51 for forming grooves. It should be noted that the fine particle layer does not necessarily have to be formed as the transparent electrode-side intermediate layer 52 so as to cover the whole transparent electrode 4, but may be formed so as to cover only the surface of the later-described conductive layer 12. The fine particle layer only needs to be formed on at least the conductive layer 12.

The size of the fine particles forming the transparent electrode-side intermediate layer 52, the number of the stacked layers therein, the thickness of the stack, and so on are adjusted as required, but if the number of the stacked layers is less than two, the transparent electrode-side intermediate layer 52 cannot completely cover the transparent electrode 4, and a region where the active layer 51 is in direct contact with the transparent electrode increases. As a result, it is not possible to selectively and efficiently transport either the electrons or the holes generated in the photoelectric conversion layer 5, leading to the deterioration of power conversion efficiency. On the other hand, increasing the number of the stacked layers so as to enable to completely cover the transparent electrode 4 increases the thickness of the stack to deteriorate conductivity especially when the size of the fine particles is large, leading to the deterioration of power conversion efficiency. For example, an inorganic material such as nickel oxide does not have a sufficient conductivity, and accordingly in a case where the size of the fine particles is, for example, 10 nm and the number of the stacked layers enabling to completely cover the transparent electrode 4 is ten, the thickness of the film stack is 100 nm at the maximum. If the film has such a large thickness, an influence of electric resistance is not negligible, and power conversion efficiency deteriorates. The transparent electrode-side intermediate layer 52 is formed by, for example, a method of applying a dispersion liquid of the fine particles, a method of spraying a dispersion liquid of the fine particles with a sprayer, a method of applying the fine particles as powder, or the like. The particle size of the fine particles forming the fine particle layer used as the transparent electrode-side intermediate layer 52 or the like is preferably not less than 1 nm nor more than 100 nm, though depending on the conductivity of the fine particles. The thickness of the fine particle layer is preferably not less than 3 nm nor more than 300 nm, though depending on the conductivity and the particle size of the fine particles. The shape of the fine particles is, for example, a perfect sphere or a shape close to the perfect sphere, but is not limited to this, and may be an ellipsoid or the like.

Part of the active layer 51 provided on the transparent electrode-side intermediate layer 52 having the stack of the fine particles preferably reaches a thickness-direction part of the transparent electrode-side intermediate layer 52, and further part of the active layer 52 is preferably out of contact with the transparent electrode 4 through the transparent electrode-side intermediate layer 52 as much as possible. When the stack of the fine particles is employed as the transparent electrode-side intermediate layer 52, part of the active layer 51 enters the inside of the transparent electrode-side intermediate layer 52, but most of the transparent electrode-side intermediate layer 52 is between the transparent electrode 4 and the active layer 51, and the transparent electrode-side intermediate layer 52 fully exhibits the function as the electron transport layer or the hole transport layer. Further, if part of the active layer 51 is in contact with the transparent electrode 4, the electrons or the holes generated in the active layer 51 cannot be selectively and efficiently transported, leading to the deterioration of the properties of the photoelectric conversion device 1.

In the case where the holes generated in the photoelectric conversion layer 5 are collected in the counter electrode 6, the counter electrode-side intermediate layer 53, that is, the first counter electrode-side intermediate layer 531 and the second counter electrode-side intermediate layer 532 are formed of a material capable of selectively and efficiently transporting the holes. The constituent material of the counter electrode-side intermediate layer 53 functioning as the hole transport layer is the same as the constituent material of the transparent electrode-side intermediate layer 52. In the case where the electrons are collected in the counter electrode 6, the first counter electrode-side intermediate layer 531 and the second counter electrode-side intermediate layer 532 are formed of a material capable of selectively and efficiently transporting the electrons. The constituent material of the counter electrode-side intermediate layer 53 functioning as the electron transport layer is the same as the constituent material of the transparent electrode-side intermediate layer 52.

The first counter electrode-side intermediate layer 531 and the second counter electrode-side intermediate layer 532 need not be the stacks of the fine particles since they do not have an influence on the scribing of the active layer 51. Therefore, the first and second counter electrode-side intermediate layers 531, 532 each may have a typical film shape, or may be a stack of fine particles similarly to the transparent electrode-side intermediate layer 52. The first and second counter electrode-side intermediate layers 531, 532 are formed by, for example, a vacuum deposition method, a sputtering method, an ion plating method, a CVD method, a sol-gel method, a plating method, a coating method, or the like. The first and second counter electrode-side intermediate layers 531, 532 each preferably have a thickness of not less than 1 nm nor more than 20 nm.

The counter electrode 6 is formed of a material having conductivity, and in some case, having a light-transmitting property. As the constituent material of the counter electrode 6, metal such as platinum, gold, silver, copper, nickel, cobalt, iron, manganese, tungsten, titanium, zirconium, tin, zinc, aluminum, indium, chromium, lithium, sodium, potassium, rubidium, cesium, calcium, magnesium, barium, samarium, or terbium, an alloy containing any of these, a conductive metal oxide such as an indium-zinc oxide (IZO), or a carbon material such as graphene or carbon nanotube is used, for example.

The counter electrode 6 is formed by, for example, a vacuum deposition method, a sputtering method, an ion plating method, a sol-gel method, a plating method, a coating method, or the like. The thickness of the counter electrode 6 is not particularly limited, but preferably is not less than 1 nm nor more than 1 μm. When the film thickness of the counter electrode 6 is too thin, resistance becomes too high, which may make it impossible to sufficiently transmit the generated electric charges to an external circuit. When the thickness of the counter electrode 6 is too thick, its film formation takes a long time and accordingly a material temperature increases, which may damage the active layer 51. Sheet resistance of the counter electrode 6 is not particularly limited, but is preferably 500Ω/□ or less, and more preferably 200Ω/□ or less.

Figure 3A:
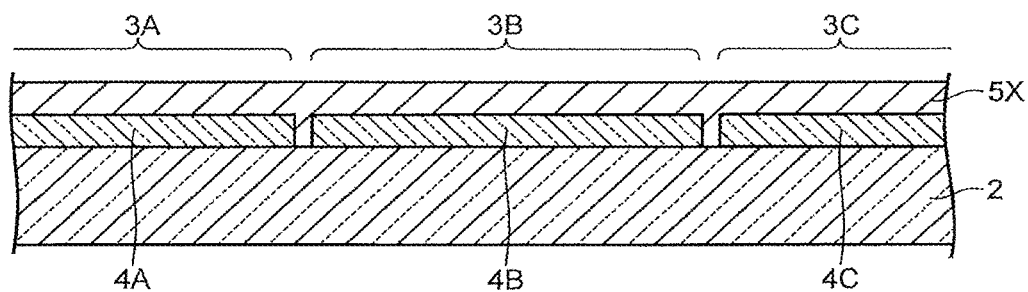
FIGS. 3A to 3C are sectional views schematically illustrating a method of manufacturing the photoelectric conversion device illustrated in FIG. 1.

Manufacturing steps of the photoelectric conversion device 1 in the embodiment will be roughly described with reference to FIGS. 3A to 3C. As illustrated in FIG. 3A, the transparent electrodes 4A, 4B, 4C corresponding to the plural photoelectric conversion parts 3A, 3B, 3C are formed on the transparent substrate 2. The transparent electrode 4B is formed so as to be adjacent to the transparent electrode 4A and so as to be physically separated to the transparent electrode 4A. Similarly, the transparent electrode 4C is formed so as to be adjacent to the transparent electrode 4B and so as to be physically separated to the transparent electrode 4B. A photoelectric conversion layer 5X is formed above the transparent substrate 2 so as to cover these transparent electrodes 4A, 4B, 4C. The photoelectric conversion layer 5X is formed on the whole surface so as to cover all the transparent electrodes 4A, 4B, 4C.

Figure 3B:
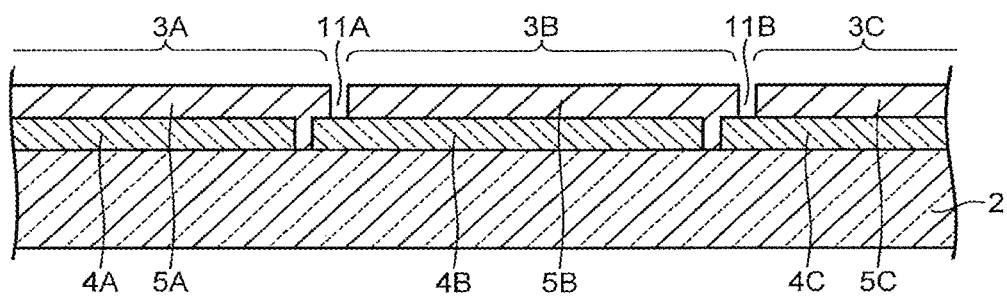

Next, as illustrated in FIG. 3B, the photoelectric conversion layer 5X is scribed, whereby dividing grooves 11A, 11B are formed so as to divide the photoelectric conversion layer 5X into a plurality of parts corresponding to the respective photoelectric conversion parts 3A, 3B, 3C. The dividing grooves 11A, 11B dividing the photoelectric conversion layer 5X are formed by a scribing method such as, for example, mechanical scribing or laser scribing. By the scribe grooves (dividing grooves) 11A, 11B dividing the photoelectric conversion layer 5X into the plural parts, the photoelectric conversion layers 5A, 5B, 5C corresponding to the plural photoelectric conversion parts 3A, 3B, 3C are formed. The dividing grooves 11A, 11B are regions where to form connection parts for electrically connecting the counter electrodes 6A, 6B of the photoelectric conversion parts 3A, 3B with the transparent electrodes 4B, 4C of the adjacent photoelectric conversion parts 3B, 3C. Therefore, the dividing grooves 11A, 11B are formed so as to make the surfaces of the transparent electrodes 4B, 4C exposed.

Examples of a method for exposing the transparent electrode 4 by using the mechanical scribing for the formation of the dividing grooves 11A, 11B include a cutoff process and a cutting process. In the cutoff process, a scribing blade having a curvature at its tip is used, and by pushing and opening up the photoelectric conversion layer 5X to both sides of the scribing blade, the transparent electrode 4 is exposed. Dust of the photoelectric conversion layer 5X is unlikely to occur, but burrs of the photoelectric conversion layer 5X becomes high, and accordingly the thickness of the film formed thereon does not become uniform, and in some case, what is called benching occurs, which may deteriorate power conversion efficiency. Since the photoelectric conversion layer 5X is pushed against the transparent electrode 4 by the scribing blade, the residue occurs on the transparent electrode 4, which possibly disables the complete exposure.

In the cutting process, a rectangular scribing blade having substantially no curvature at its tip is used to scrape the photoelectric conversion layer 5X, whereby the transparent electrode 4 is exposed. Though the dust of the photoelectric conversion layer 5X is highly possible to occur, the height of the burrs of the photoelectric conversion layer 5X is reduced to low and in addition the residue is unlikely to occur on the transparent electrode 4, and thus it has an advantage that the surface of the transparent electrode 4 is relatively easily exposed. The generated dust is preferably removed, for which suction, blowing, wiping using a sticky substance, or a method using electrostatic force is used, for instance. As will be described later, in consideration of removability of the photoelectric conversion layer 5X, the cutting process using the rectangular scribing blade having substantially no curvature at its tip is preferably used for the mechanical scribing of the photoelectric conversion layer 5X.

Figure 3C:
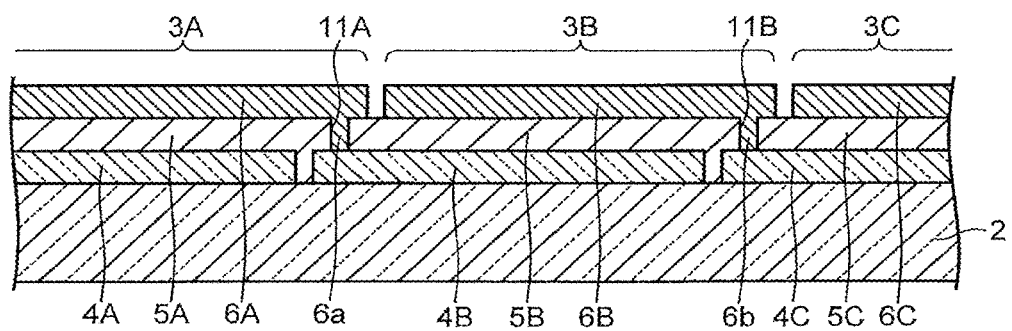

As illustrated in FIG. 3C, the counter electrodes 6A, 6B, 6C corresponding to the plural photoelectric conversion parts 3A, 3B, 3C are formed on the photoelectric conversion layers 5A, 5B, 5C respectively. In forming the counter electrodes 6A, 6B of the photoelectric conversion parts 3A, 3B, parts (counter electrode materials) 6a, 6b of the counter electrodes 6A, 6B are buried in the dividing grooves 11A, 11B provided between the photoelectric conversion parts 3A, 3B and the photoelectric conversion parts 3B, 3C. In this manner, the counter electrodes 6A, 6B of the photoelectric conversion parts 3A, 3B are electrically connected with the transparent electrodes 4B, 4C of the adjacent photoelectric conversion parts 3B, 3C via the counter electrode materials 6a, 6b filled in the dividing grooves 11A, 11B.

Incidentally, in a conventional manufacturing step, in order to electrically connect the counter electrodes 6A, 6B of the photoelectric conversion parts 3A, 3B with the transparent electrodes 4B, 4C of the adjacent photoelectric conversion parts 3B, 3C, surfaces of the transparent electrodes 4B, 4C are exposed to the inside of the groove portions 11A, 11B. The dividing grooves 11A, 11B are formed by mechanical scribing using a cutting tool or laser scribing. In mechanically scribing the photoelectric conversion layer 5X, applying a pressure with which the surfaces of the transparent electrodes 4B, 4C are surely exposed is likely to cause a crack or the like in the transparent electrodes 4B, 4C if the transparent electrodes 4B, 4C are formed of a hard and brittle transparent conductive oxide. Especially when a soft substrate formed of an organic material is used as the transparent substrate 2, the soft substrate deforms when pushed by the cutting tool, which is more likely to cause a crack or the like in the transparent electrodes 4B, 4C Further, if the surfaces of the transparent electrodes 4B, 4C are exposed, the transparent electrodes 4B, 4C come into direct contact with the counter electrodes 6 made of silver, aluminum, or the like having a work function greatly different from a work function of the transparent electrodes 4B, 4C, which is likely to cause galvanic corrosion.

On the other hand, if the mechanical scribing pressure is decreased in the conventional manufacturing step in order to prevent the crack of the transparent electrodes 4B, 4C, part of the photoelectric conversion layer 5X is likely to remain in the groove portions 11A, 11B. If the soft and viscous photoelectric conversion layer 5X existing on the hard transparent electrodes 4B, 4C is tried to be mechanically cut (scribed), part of the photoelectric conversion layer 5X is likely to remain in the groove portions 11A, 11B. Especially when a flexible substrate formed of a soft material such as resin is used as the transparent substrate 2, the soft substrate deforms when pushed by the cutting tool, which is more likely to cause a crack in the transparent conductive oxide layers. If part of the photoelectric conversion layer 5X remains in the dividing grooves 11A, 11B, electric resistance (series connection resistance) between the counter electrodes 6A, 6B of the photoelectric conversion parts 3A, 3B and the transparent electrodes 4B, 4C of the adjacent photoelectric conversion parts 3B, 3C increases, resulting in deterioration of power conversion efficiency.

The series connection resistance between the counter electrodes 6A, 6B of the photoelectric conversion parts 3A, 3B and the transparent electrodes 4B, 4C of the adjacent photoelectric conversion parts 3B, 3C is preferably 5Ω or less, and more preferably 2.5Ω or less. In a photovoltaic, while it is irradiated with light, an I-V curve is obtained, from which characteristic values such as short-circuit current density Jsc, open circuit voltage Voc, fill factor FF, series resistance Rs, and parallel (shunt) resistance Rsh are obtained. Power conversion efficiency has a higher value as the series resistance Rs is lower. Since the series resistance Rs includes the series connection resistance, the series connection resistance is preferably as low as possible. In order to obtain practical power conversion efficiency in a wide variety of applications, the series connection resistance per unit area is preferably 30 Ω·cm$^2$ or less, and more preferably 15 Ω·cm$^2$ or less. Further, in order to obtain a generally practical power generation amount in a wide variety of applications, a power generation area needs to be 3 cm$^2$ or more. The series resistance Rs, when calculated with these points taken into consideration, is preferably 10Ω or less, and more preferably 5Ω or less. In view of reducing a ratio occupied by the series connection resistance in the series resistance Rs to half or less, the series connection resistance is preferably 5Ω or less, and more preferably 2.5Ω or less. It is possible to achieve the above series connection resistance by employing the following method of forming the scribe grooves of the embodiment and the scribe grooves based on the method.

In the method of manufacturing the photoelectric conversion device 1 of the embodiment, the following structure and steps are employed for forming the dividing grooves 11A, 11B and the connection parts using the dividing grooves 11A, 11B. A connection step of the photoelectric conversion parts 3 in the method of manufacturing the photoelectric conversion device 1 of the embodiment and the structure of the connection parts will be described with reference to FIGS. 4A to 4D and FIGS. 5A to 5C. FIGS. 4A to 4D are sectional views illustrating the connection step of the photoelectric conversion parts 3, and FIGS. 5A to 5C are plane views illustrating the connection step of the photoelectric conversion parts 3. Though FIGS. 4A to 4D and FIGS. 5A to 5C illustrate the connection step of the photoelectric conversion part 3A and the photoelectric conversion part 3B adjacent thereto, the connection step of the photoelectric conversion part 3B and the photoelectric conversion part 3C adjacent thereto is also executed in the same manner. The same applies to a case where the photoelectric conversion device 1 has four or more photoelectric conversion parts 3, and the adjacent photoelectric conversion parts 3 are serially connected in sequence by the same step.

Figure 4A:
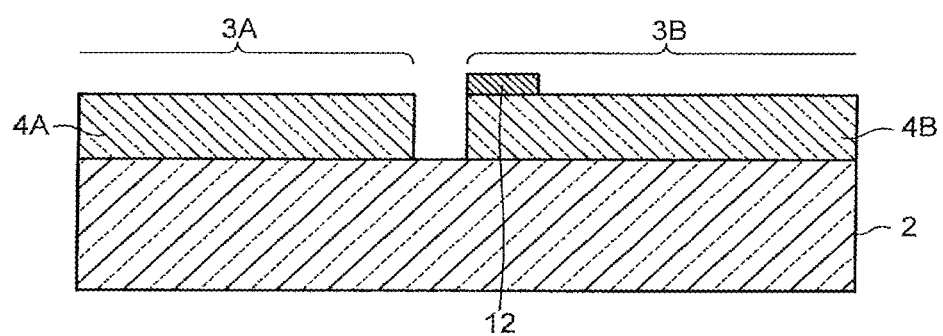
FIGS. 4A to 4D are sectional views illustrating a connection step of the photoelectric conversion parts in the method of manufacturing the photoelectric conversion device of the embodiment and the structure of a connection part.
Figure 5A:
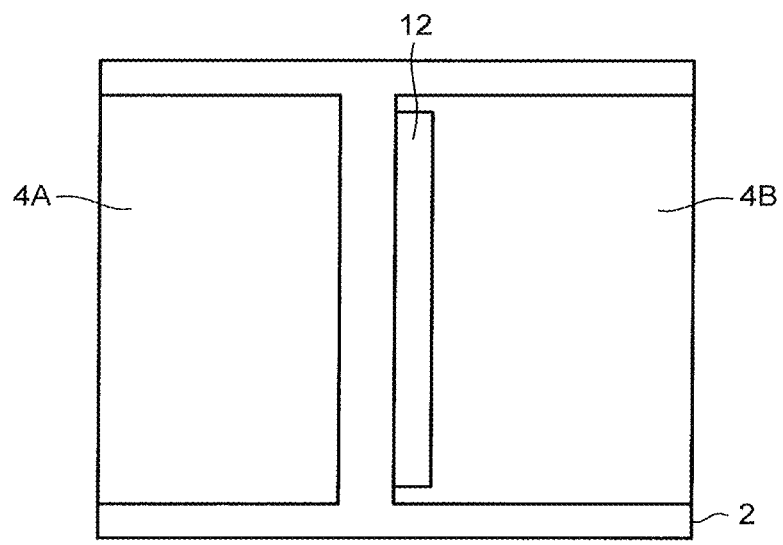
FIGS. 5A to 5C are plane views illustrating the connection step of the photoelectric conversion parts in the method of manufacturing the photoelectric conversion device of the embodiment.
Figure 5B:
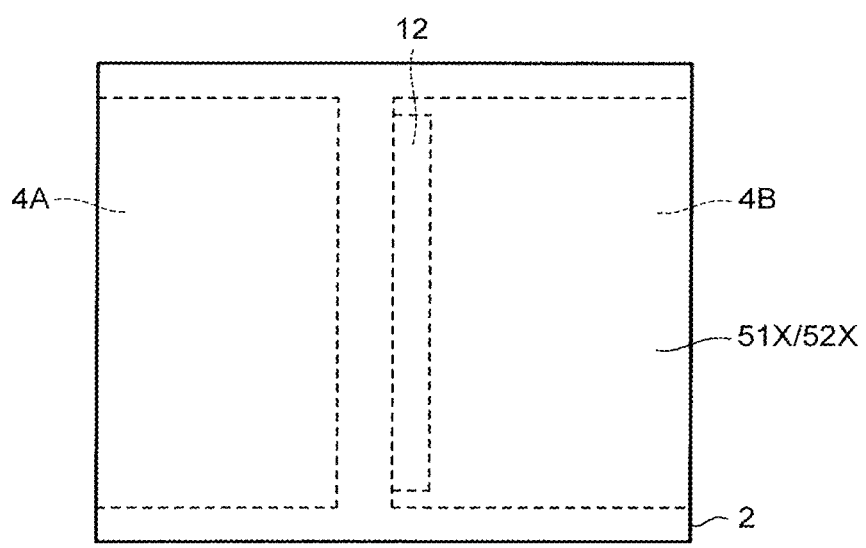
Figure 5C:
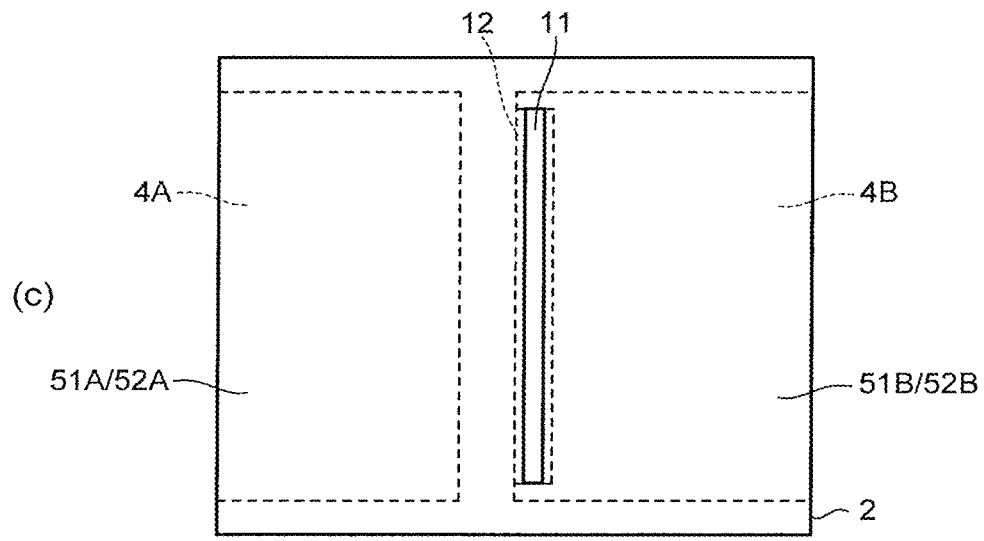

As illustrated in FIG. 4A and FIG. 5A, the conductive layer 12 is formed on the transparent electrode 4B of the photoelectric conversion part 3B with which the counter electrode 6A of the photoelectric conversion part 3A is to be electrically connected. The conductive layer 12 functions as a formation region and a base layer of the dividing groove 11A when the photoelectric conversion layer 5X is scribed. Accordingly, the conductive layer 12 is formed only on a region, of the transparent electrode 4B, corresponding to a scribe region of the photoelectric conversion layer 5X. The conductive layer 12 is formed only on a partial region adjacent to the transparent electrode 4A on the transparent electrode 4B. The conductive layer 12 has a metal layer formed of at least one noble metal element selected from the group consisting of gold, silver, platinum, palladium, iridium, rhodium, osmium, and ruthenium, and an alloy containing noble metal. That is, the conductive layer 12 is a metal layer containing noble metal as a main component. The conductive layer 12 may have a stacked structure in which a plurality of metal layers are stacked, but its front surface side (side serving as the base at the time of the scribing) is the metal layer containing the noble metal as the main component. For example, gold is low in adhesion with an oxide or the like, and therefore in a case where a conductive metal oxide is used as the transparent electrode 4, a metal layer of cobalt, nickel, titanium, zirconium, molybdenum, tungsten, chromium, or tantalum may be formed as an adhesive layer, followed by the formation of the noble metal layer thereon.

Figure 4B:
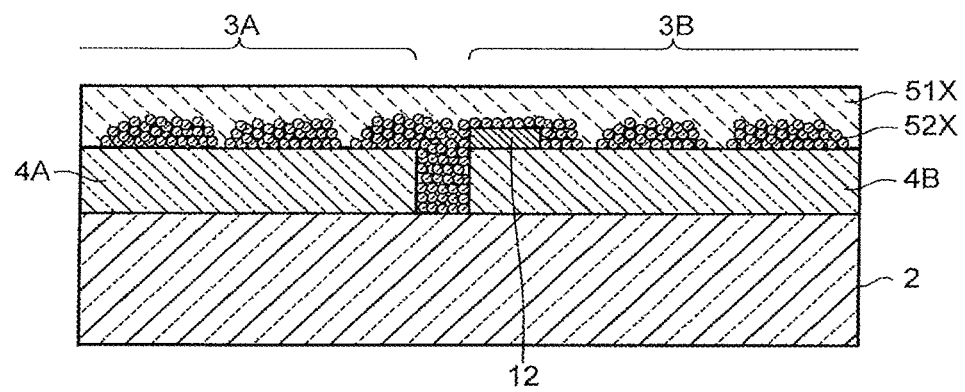
Figure 4C:
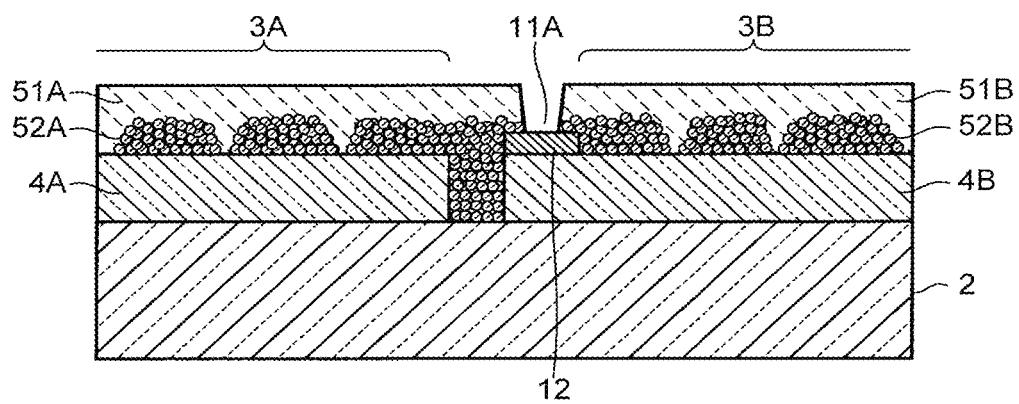

Next, as illustrated in FIG. 4B and FIG. 5B, a transparent electrode-side intermediate layer 52X and an active layer 51X are sequentially formed above the transparent substrate 2 so as to entirely cover the transparent electrode 4A, the transparent electrode 4B, and the conductive layer 12. Subsequently, as illustrated in FIG. 4C and FIG. 5C, a film stack of the transparent electrode-side intermediate layer 52X and the active layer 51X is scribed along the formation region of the conductive layer 12, whereby the dividing groove 11A is formed to expose the surface of the conductive layer 12. By the dividing groove 11A being formed to divide the film stack of the transparent electrode-side intermediate layer 52X and the active layer 51X into a plurality of parts, the transparent electrode-side intermediate layers 52A, 52B and the active layers 51A, 51B corresponding to the photoelectric conversion parts 3A, 3B are formed. The dividing groove 11A is formed by the mechanical scribing or the laser scribing of the film stack of the transparent electrode-side intermediate layer 52X and the active layer 51X as previously described. In a case where the not-illustrated first counter electrode-side intermediate layer is formed on the active layer 51X, the dividing groove 11A is formed by the scribing of a film stack of the transparent electrode-side intermediate layer 52X, the active layer 51X, and the not-illustrated first counter electrode-side intermediate layer.

The formation step of the dividing groove 11A is executed by the mechanical scribing or the laser scribing so as to expose the surface of the conductive layer 12 without scraping the conductive layer 12. This can prevent the cutting chips of the conductive layer 12, which is a conductive substance, from being present as the residue in the periphery, and accordingly makes it possible to inhibit a short circuit between the cells (for example, the photoelectric conversion part 3A and the photoelectric conversion part 3B) ascribable to the cutting chips of the conductive substance. On the other hand, the scribing up to part of the conductive layer 12, though capable of sufficiently exposing the conductive layer 12, produces a relatively large amount of the cutting chips of the conductive layer 12 to complicate a removing step of the cutting chips. In addition, if a step of fabricating a photovoltaic module or the like, for example, a step of bonding a sealing substrate is executed while the cutting chips are left incompletely removed, the cutting chips, which are conductive, may cause a short circuit between the transparent electrodes 4A, 4B and the counter electrodes 6A, 6B. Moreover, the scribing up to part of the conductive layer 12 may accelerate the abrasion of the scribing blade, for instance.

In the photoelectric conversion device 1 of the embodiment and its manufacturing steps, the conductive layer 12 whose main component is the noble metal and the transparent electrode-side intermediate layer 52X formed of the stack of the fine particles are inserted between the soft and viscous active layer 51X and the transparent electrodes 4. Being small in ionization tendency and low in reactivity (being less likely to undergo oxidation or the like), noble metals can weaken an adhesion force with the transparent-side intermediate layer 52X. Further, being the stack of the fine particles, the transparent electrode-side intermediate layer 52X has a small contact area with the conductive layer 12, and can be weak in adhesion with the conductive layer 12. Because of these effects, the conductive layer 12 is not scraped, and it is possible to prevent part of the transparent electrode-side intermediate layer 52X and the active layer 51X from remaining in the groove portion 11A when the film stack of the transparent electrode-side intermediate layer 52X and the active layer 51X is scribed.

Figure 6:
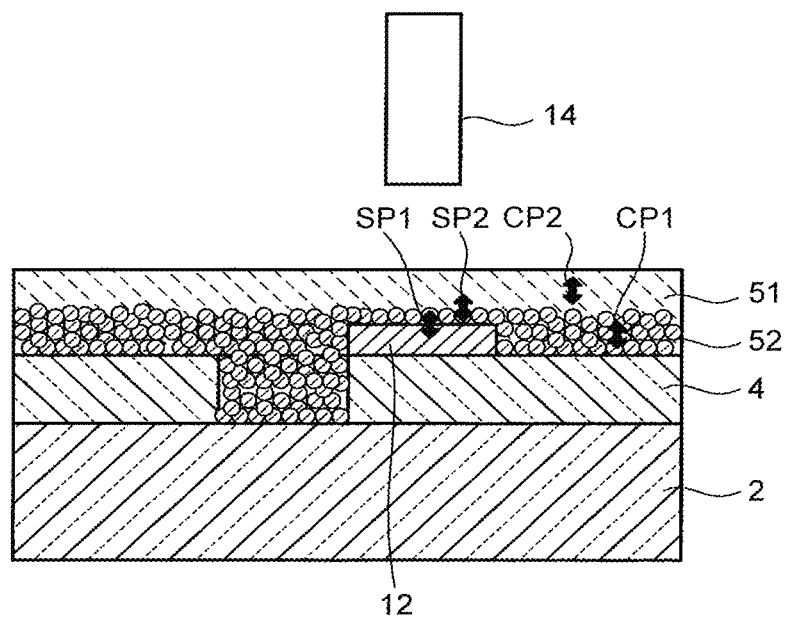
FIG. 6 is an explanatory view of forces acting between parts and in the parts in the connection step of the photoelectric conversion parts of the embodiment.

FIG. 6 illustrates a state when the film stack of the transparent electrode-side intermediate layer 52X and the active layer 51X is mechanically scribed with the scribing blade 14. The arrows in FIG. 6 represent four important forces having an influence on the scribing properties out of forces acting during the mechanical scribing. Specifically, these four forces are an adhesion force SP1 acting between the conductive layer 12 and the transparent electrode-side intermediate layer 52X, a cohesive force CP1 of the transparent electrode-side intermediate layer 52X, an adhesion force SP2 acting between the transparent electrode-side intermediate layer 52X and the active layer 51X, and a cohesive force CP2 of the active layer 51X. In exposing the surface of the conductive layer 12, it is more advantageous that the adhesion force SP1 out of the four forces is the weakest.

In the photoelectric conversion device 1 of the embodiment and its manufacturing steps, the use of the noble metals as the conductive layer 12 and the use of the stack of the fine particles as the transparent electrode-side intermediate layer 52X weaken the adhesion force SP1 acting between the conductive layer 12 and the transparent electrode-side intermediate layer 52 X as described above. Consequently, when the film stack of the transparent electrode-side intermediate layer 52X and the active layer 51X is mechanically scribed with the scribing blade 14, it is possible to detach the film stack from an interface of the conductive layer 12 and the transparent electrode-side intermediate layer 52X between which the adhesion force SP1 is weakened and expose the surface of the conductive layer 12 without scraping the conductive layer 12. Therefore, while the occurrence of the short circuit and the like ascribable to the cutting chips of the conductive layer 12 is inhibited, it is possible to enhance electrical connectivity between the counter electrode 6A of the photoelectric conversion part 3A and the transparent electrode 4B of the photoelectric conversion part 3B. Further, the decrease in the adhesion force SP1 acting between the conductive layer 12 and the transparent electrode-side intermediate layer 52X enables an improvement in easiness of scribe at the time of the laser scribing. In this case as well, it is possible to enhance electrical connectivity between the counter electrode 6A of the photoelectric conversion part 3A and the transparent electrode 4B of the photoelectric conversion part 3B.

Further, the use of the stack of the fine particles as the transparent electrode-side intermediate layer 52X is expected to bring about an effect of increasing the adhesion force SP2 acting between the transparent electrode-side intermediate layer 52X and the active layer 51X. That is, since the active layer 51X is formed by coating using, for example, ink on the transparent electrode-side intermediate layer 52X which has a larger surface area because of being formed as the stack of the fine particles, the active layer 51X moderately permeates the stack of the fine particles to have an increased contact area, resulting in an increase in the adhesion force SP2. If the cohesive force CP2 of the active layer 51X is the weakest, the residue also occurs. As compared with the active layer 51 that is an organic active layer containing a p-type semiconductor and an n-type semiconductor, the active layer 51X that uses the organic/inorganic hybrid perovskite is lower in the cohesive force and thus fracture occurs in the film of the active layer 51X, which may make it difficult to expose the surface of the conductive layer 12. Regarding this point, by using the noble metals as the conductive layer 12 and using the stack of the fine particles as the transparent electrode-side intermediate layer 52X as in the embodiment, it is possible to make the adhesion force SP1 lower than the cohesive force CP2 of the active layer 51X, enabling the exposure of the surface of the conductive layer 12 without any residue.

Figure 4D:
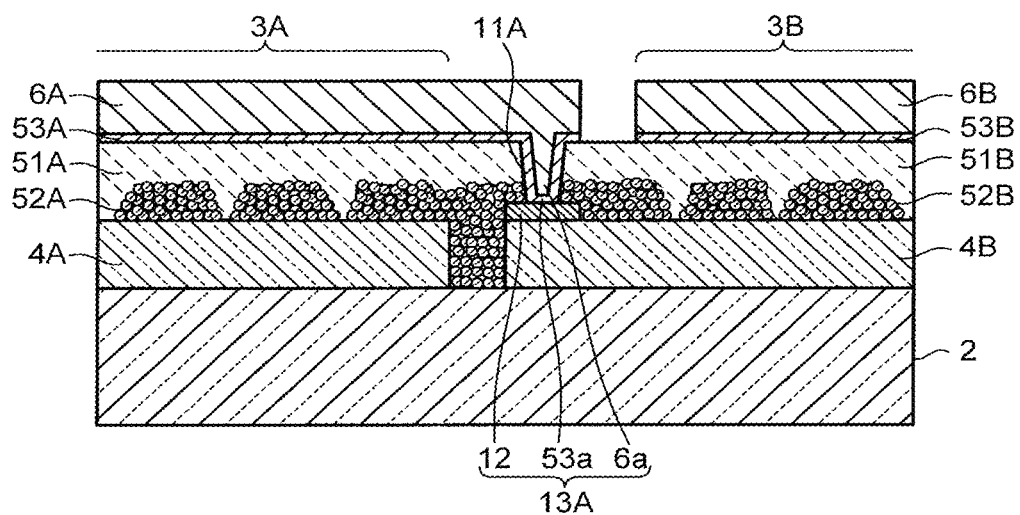

Next, as illustrated in FIG. 4D, the counter electrode-side intermediate layers 53A, 53B and the counter electrodes 6A, 6B corresponding to the respective photoelectric conversion parts 3A, 3B are sequentially formed on the active layers 51A, 51B. In forming the counter electrode-side intermediate layer 53A and the counter electrode 6A of the photoelectric conversion part 3A, part (intermediate layer material) 53a of the counter electrode-side intermediate layer 53A and part (counter electrode material) 6a of the counter electrode 6A are buried in the dividing groove 11A provided between the photoelectric conversion part 3A and the adjacent photoelectric conversion part 3B. In this manner, the counter electrode 6A of the photoelectric conversion part 3A is electrically connected with the transparent electrode 4B of the adjacent photoelectric conversion part 3B by a connection part 13A having the conductive layer 12 and having the intermediate layer material 53a and the counter electrode material 6a which are filled in the dividing groove 11A. It should be noted that the counter electrode-side intermediate layer material 53a in the dividing groove 11A is not essential but may be formed only in a region other than the dividing groove 11A.

According to the photoelectric conversion device 1 of the embodiment and the manufacturing method thereof, it is possible to prevent part of the active layer 51 and so on from remaining in the dividing groove 11 without causing a crack of the like in the transparent electrode 4 at the time of the scribing. Therefore, it is possible to improve electrical connectivity between the adjacent photoelectric conversion parts 3. Specifically, it is possible to reduce electrical resistance of the connection part 13A connecting the counter electrode 6A of the photoelectric conversion part 3A and the transparent electrode 4B of the adjacent photoelectric conversion part 3B, that is, reduce the series connection resistance down to 5Ω or less and further 2.5Ω or less as previously described. An increase in the series connection resistance between the photoelectric conversion parts 3 becomes a cause to deteriorate power conversion efficiency of the photoelectric conversion device 1. According to the photoelectric conversion device 1 of the embodiment and the method of manufacturing the same, it is possible to improve power conversion efficiency. Even when the number of the serially connected photoelectric conversion parts 3 is increased, reducing a probability of an increase in the connection resistance between the adjacent photoelectric conversion parts 3 makes it possible to enhance power conversion efficiency as the whole device.

In the photoelectric conversion device 1 of the embodiment and the method of manufacturing the same described above, the stack of the fine particles is employed as the transparent electrode-side intermediate layer 52, but the stack of the fine particles is not limited to this. As previously described, the stack of the fine particles may be formed only on the conductive layer 12. In this case, the stack of the fine particles is formed on the conductive layer 12, and the transparent electrode-side intermediate layer 52 is formed thereon separately from the stack of the fine particles. The transparent electrode-side intermediate layer 52 is provided as required, and its formation can be omitted in some case. The stack of the fine particles only needs to be provided directly on the conductive layer 12 so as to come into contact with the conductive layer 12, and only needs to be formed on at least the conductive layer 12. In a case where such a structure is employed, the constituent material of the fine particles is not particularly limited, but preferably, it is not a conductive material and is an electrically insulating material or a low conductivity material similar to the constituent material of the transparent electrode-side intermediate layer 52 so that its residue does not become a factor to cause an electrical failure.

EXAMPLES

Next, examples and their evaluation results will be described.

Example 1

First, a plurality of 150 nm-thick ITO films were formed as transparent electrodes, on a glass substrate with a 700 μm thickness. The number of the ITO films formed was eight corresponding to the number of photoelectric conversion parts installed. That is, they were formed so as to correspond to an eight-series module. Next, on left edge portions of the eight ITO films, conductive layers each having a stacked structure of Mo and Au were formed. The Mo layers were used as adhesive layers between the transparent electrodes and the Au layers. The conductive layers each had a width of about 0.5 mm, and their Mo layers had a thickness of 50 nm and their Au layers had a thickness of 300 nm. On the glass substrate having the eight ITO films and the conductive layers provided only on partial regions of the ITO films, a stack of nanoparticles of nickel oxide ($NiO_xNP$) was formed as a transparent electrode-side intermediate layer. The nanoparticles of nickel oxide had a particle size of about 7 nm and a thickness of about 20 nm. Therefore, the transparent electrode-side intermediate layer is a film stack in which two to three layers of the nanoparticles are stacked as illustrated in the enlarged cross-sectional photograph in FIG. 7.

Next, a perovskite layer was formed as an active layer. As a perovskite material, $CH_3NH_3PbI_{2.4}Br_{0.6}$ was used. As a solvent of a perovskite material ink, a mixed solvent of dimethylformamide (DMF) and dimethyl sulfoxide (DMSO) in a 1:1 ratio was used. After the perovskite material ink was applied on the transparent electrode-side intermediate layer, the substrate was immersed in a vessel containing chlorobenzene. Thereafter, the substrate was taken out and heated at 80° C. for sixty minutes, whereby the perovskite layer was formed. Its film thickness was about 250 nm. Next, as a first counter electrode-side intermediate layer, PC60BM ([6,6]-phenyl C61 butyric acid methyl ester) was deposited. As a solvent of a PC60BM ink, monochlorobenzene was used. After the PC60BM ink was applied, it was naturally dried. Its film thickness was about 50 nm.

Next, mechanical scribing was performed along formation regions of the conductive layers. As a scribing tool, an 80 μm-wide cutting tool having a rectangular tip was used. In the mechanical scribing, the scribing tool was pressed by a suspension mechanism using a spring having a predetermined force and was scanned in parallel to a longitudinal direction of the conductive layers. When the pressure of the scribing tool was within a range of 0.002 to 0.2 mN/μm², the three of PC60BM layer, perovskite layer, and $NiO_xNpP$ layer were scraped away with almost no residue, and it was possible to expose the conductive layers. Further, the scribing did not go so far as to scrape the conductive layers. When the pressure was reduced to 0.001 mN/μm², the residue was seen at some part. The conductive layers were not scraped. When the pressure was increased to 0.3 mN/μm², the conductive layers were also scraped.

Next, as a second counter electrode-side intermediate layer, a film of BCP (2,9-dimethyl-4,7-diphenyl-1,10-phenanthroline) with an about 20 nm thickness was formed by vacuum deposition. Next, as a counter electrode, an about 150 nm-thick film of Ag was formed by vacuum deposition. With a common deposition mask used on the two layers, eight second counter electrode-side intermediate layers and eight counter electrodes were formed corresponding to the number of the photoelectric conversion parts installed. Consequently, an eight-series module structure was formed. The area of one photoelectric conversion part is about 2.8 cm².

Regarding the aforesaid eight-series photoelectric conversion device module, the resistance (series connection resistance) of series connection parts passing through mechanical scribe parts was measured. In the measurement of the series connection resistance, anode wirings were connected to counter electrode-side contact pads, and cathode wirings were connected to the counter electrodes. When the polarity was reversed, substantially the same values were also obtained in all of the following measurement results of the series connection resistance. Wiring positions of the anode wirings are slightly apart from the series wiring parts, but a value of electrical resistance therebetween is almost negligible. Specifically, the counter electrode-side contact pads each have the same structure as that of the conductive layers, that is, the stacked structure of the 50 nm Mo layer and the 300 nm Au layer as previously described, and since the thickness of the Au layers are no less than 300 nm, the electrical resistance from the wiring positions of the anode wirings up to the series wiring parts is an almost negligible value of 0.1Ω or less. In the measurement of the series connection resistance, the wiring positions are set at positions as close to the series wiring parts as possible, or even if they are apart from the series wiring parts, the electric resistance therebetween only needs to be set to a value not influencing the measurement value of the series connection resistance.

The wiring positions of the cathode wirings are set at only two places which are longitudinal end portions of the rectangular counter electrode. However, since the thickness of the Ag layers of the counter electrodes is 150 nm as previously described, the electric resistance from the wiring positions of the cathode wirings up to the series wiring parts is an almost negligible value of 0.1Ω or less. In the measurement of the series connection resistance, the wiring positions are set at positions as close to the series wiring parts as possible, or even if they are apart from the series wiring parts, the electric resistance therebetween only needs to be set to a value not influencing the measurement value of the series connection resistance.

In the photoelectric conversion device module of the example 1, when the pressure of the scribing tool was within the range of 0.002 to 0.2 mN/μm$^2$, the series connection resistance was 0.2Ω on average. Even when the pressure of the scribing tool was increased to 0.3 mN/μm$^2$, the series connection resistance was 0.2Ω. However, since the conductive layers are also scraped, it may not be possible to prevent the occurrence of a short circuit and the like. The aforesaid value of the series connection resistance is a low and thus favorable value giving almost no adverse effect on power conversion efficiency in the operation as practical photovoltaic in a wide variety of applications as previously described. As described above, a favorable series module with a low series connection resistance was obtained.

Example 2

A photoelectric conversion device module was fabricated in the same manner as in the example 1 except that the material of the active layer was changed from the perovskite material to an organic thin film and the first counter electrode-side intermediate layer was not formed. The organic thin film active layer was formed as a bulk hetero type using PTB7 as a p-type semiconductor material and using PC70BM as an n-type semiconductor material, and its film thickness was about 100 nm. As a solvent of an active layer ink, monochlorobenzene was used. After applied, it was dried at 60° C. for 120 minutes.

When the pressure of the scribing tool was within a range of 0.002 to 0.2 mN/μm$^2$, the two organic thin film layer and NiO$_x$NP layer were scraped away with almost no residue and it was possible to expose the conductive layers. Further, the scribing did not go so far as to scrape the conductive layers. These evaluation results are the same as those of the example 1. Even when the pressure was decreased to 0.001 mN/μm$^2$, the residue was not seen and it was possible to expose the conductive layers unlike the example 1. The conductive layers were not scraped as in the example 1. When the pressure was increased to 0.3 mN/μm$^2$, the conductive layers were also scraped as in the example 1. As described above, in the case where the removal target by the scribing is the perovskite type, the removal is difficult as compared with the case where the removal target by the scribing is the organic thin film type, but by employing the structure of the embodiment, it is possible to obtain a favorable value of the series connection resistance.

Comparative Example 1

A photoelectric conversion device module was fabricated in the same manner as in the example 1 except that the conductive layers were each changed from the stacked structure of the Mo film and the Au film to a stacked structure of a Mo film, an Al film, and a Mo film. When the pressure of the scribing tool was within a range of 0.001 to 0.3 mN/μm$^2$, the residue was seen in substantially the entire regions of the scribe scanning parts, and it was not possible to expose the conductive layers. The series connection resistance was 83Ω on average. This value is a value having a great adverse effect on power conversion efficiency. When the pressure was increased to 0.4 mN/μm$^2$, the conductive layers were scraped. In this case, the residue was not seen and the series connection repentance was 0.2Ω.

Comparative Example 2

A photoelectric conversion device module was fabricated in the same manner as in the example 1 except that the nanoparticle layer of nickel oxide was formed directly on the ITO layers without forming the conductive layers as the bases of the scribe parts. When the pressure of the scribing tool was within a range of 0.001 to 0.4 mN/μm$^2$, the residue was seen in substantially the entire regions of the scribe scanning parts, and it was not possible to expose the ITO layers.

From the comparative examples 1, 2, it has been found out that the removal is significantly difficult in the case where the base of the scribe part is the stacked structure of the Mo film, the Al film, and the Mo film or is the ITO layer, as compared with the case where the base of the scribe part is the stacked structure of the Mo film and the Au film. It can be understood that only in the case where the base has a low adhesion force with an object, like Au, in other words, only in a case where the base is noble metal small in ionization tendency and low in reactivity, the removal is possible.

Figure 7:
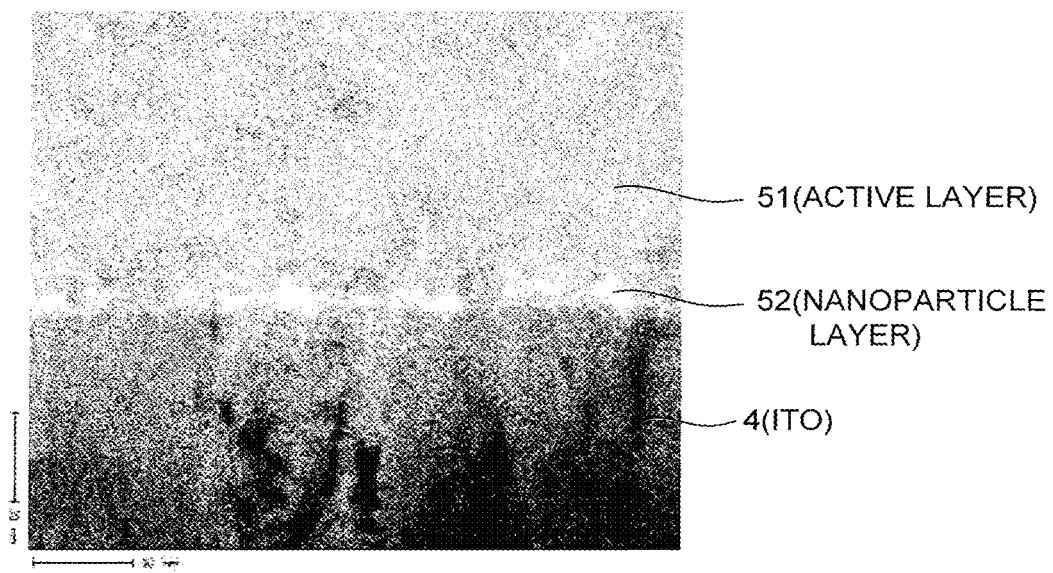
FIG. 7 is an enlarged cross-sectional photograph illustrating an essential part of a photoelectric conversion device fabricated in an example 1.

Further, cross-section observation shows that, as is illustrated in FIG. 7, there are many gaps between the ITO layer and the nanoparticle layer of nickel oxide and a contact area of these two layers is small. That is, it can be understood that because of the nanoparticles, the contact area with the base is small and accordingly the adhesion force is weak, further facilitating the removal. Incidentally, that there are many gaps between the ITO layer and the nanoparticle layer of nickel oxide means that the viscous active layer does not penetrate the nanoparticle layer deeply and is scarcely in direct contact with ITO, and it can be understood that this works well to weaken the adhesion force to further facilitate the removal.

Example 3

A photoelectric conversion device module was fabricated in the same manner as in the example 1 except that the substrate was changed from glass to polyethylene naphthalate (PEN). The PEN substrate has a 125 μm thickness. When the pressure of the scribing tool was within a range of 0.002 to 0.2 mN/μm$^2$, the three PC60BM layer, perovskite layer, and NiO$_x$NP layer were scraped away with almost no residue and it was possible to expose the conductive layers. The scribing did not go so far as to scrape away the conductive layers. The series connection resistance was 0.2Ω. When the pressure was decreased to 0.001 mN/μm$^2$, the residue was seen at some part. All of these results are the same as those when the substrate is glass, and are favorable results. When the pressure was increased to 0.3 mN/μm$^2$, damage to the ITO layers was seen. As for this result, it can be understood that, since the substrate was the soft PEN, the increase in pressure caused the deformation of the PEN substrate, which accordingly damaged ITO on the PEN substrate.

As described above, it has been found out that in order to prevent damage to ITO, which is a brittle material, formed on the soft substrate, the pressure needs to be an ultra-low pressure of less than 0.3 mN/μm$^2$. However, by providing the noble metal as the base of the scribe part and providing the nanoparticle layer between the layer of the noble metal and the perovskite layer high in adhesion, it was possible to scrape away the three PC603BM layer, perovskite layer, and NiO$_x$NP layer with almost no residue and expose the conductive layers, at an ultra-low pressure and in a wide pressure range of 0.002 to 0.2 mN/μm$^2$. As described above, it has been confirmed that, even when the substrate is the soft substrate such as the PEN substrate, it is possible to obtain a series module that is light-weighted, flexible, low in the series connection resistance, and practical in a wide variety of applications, by providing the conductive layer of the noble metal as the base of the scribing and employing the stack of the nanoparticles as the transparent electrode-side intermediate layer.

While certain embodiments of the present invention have been described, these embodiments have been presented by way of example only, and are not intended to limit the scope of the inventions. Indeed, the novel embodiments described herein may be embodied in a variety of other forms; furthermore, various omissions, substitutions and changes may be made without departing from the spirit of the inventions. The inventions described in the accompanying claims and their equivalents are intended to cover such forms or modifications as would fall within the scope and spirit of the inventions.

What is claimed is:

1. A photoelectric conversion device comprising:
a transparent substrate;
a first photoelectric conversion part including a first transparent electrode provided on the transparent substrate, a first active layer disposed on the first transparent electrode, and a first counter electrode disposed on the first active layer;
a second photoelectric conversion part including a second transparent electrode provided on the transparent substrate adjacently to the first transparent electrode and separated from the first transparent electrode, a conductive layer which is formed on a partial region adjacent to the first transparent electrode on the second transparent electrode and contains noble metal as a main component, a fine particle layer disposed on at least the conductive layer so as to be in direct contact with the conductive layer and having a stack of fine particles, a second active layer disposed to cover the second transparent electrode and the fine particle layer, and a second counter electrode disposed on the second active layer; and
a connection part which includes a scribe groove formed between the first active layer and the second active layer, and a conductive portion filled in the scribe groove, the scribe groove penetrating through the second active layer and the fine particle layer to expose a surface of the conductive layer, and the conductive portion having a part of the first counter electrode filled in the scribe groove, the connection part electrically connecting the first counter electrode and the second transparent electrode via the conductive portion and the conductive layer.

2. The device according to claim 1, wherein the noble metal is at least one element selected from the group consisting of gold, silver, platinum, palladium, iridium, rhodium, osmium, and ruthenium.

3. The device according to claim 1, wherein:
the first photoelectric conversion part includes a first transparent electrode-side intermediate layer provided on the first transparent electrode and having a stack of fine particles; and
the second photoelectric conversion part includes a second transparent electrode-side intermediate layer provided as the fine particle layer on the second transparent electrode and the conductive layer.

4. The device according to claim 3, wherein the first and second transparent electrode-side intermediate layers each have fine particles of an inorganic material, an organic material, or a carbon material functioning as an electron transport layer or a hole transport layer.

5. The device according to claim 3, wherein:
the first photoelectric conversion part includes a first counter electrode-side intermediate layer disposed between the first active layer and the first counter electrode; and
the second photoelectric conversion part includes a second counter electrode-side intermediate layer disposed between the second active layer and the second counter electrode.

6. The device according to claim 3, wherein:
part of the first active layer reaches a thickness-direction part of the first transparent electrode-side intermediate layer; and
part of the second active layer reaches a thickness-direction part of the second transparent electrode-side intermediate layer.

7. The device according to claim 1, wherein the connection part electrically connecting the first counter electrode and the second transparent electrode has a $5\Omega$ series connection resistance or less.

8. The device according to claim 1, wherein the scribe groove is a mechanical scribe groove.

* * * * *